United States Patent
Lin

(10) Patent No.: US 7,250,802 B2
(45) Date of Patent: *Jul. 31, 2007

(54) CLOCK GENERATOR HAVING A 50% DUTY-CYCLE

(75) Inventor: Tsung-Hsien Lin, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/222,631

(22) Filed: Sep. 9, 2005

(65) Prior Publication Data

US 2006/0034408 A1 Feb. 16, 2006

Related U.S. Application Data

(63) Continuation of application No. 10/132,856, filed on Apr. 25, 2002, now Pat. No. 6,990,143.

(51) Int. Cl.
*H03K 3/017* (2006.01)
(52) U.S. Cl. ........................ 327/175; 327/170
(58) Field of Classification Search ............. None
See application file for complete search history.

(56) References Cited

U.S. PATENT DOCUMENTS

| 5,757,218 | A  | * | 5/1998  | Blum ............. 327/175 |
| 6,060,922 | A  | * | 5/2000  | Chow et al. .......... 327/175 |
| 6,426,660 | B1 | * | 7/2002  | Ho et al. ............ 327/175 |
| 6,654,900 | B1 | * | 11/2003 | Cave ............... 713/501 |
| 6,831,493 | B2 | * | 12/2004 | Ma ................. 327/175 |
| 6,882,196 | B2 | * | 4/2005  | Yee et al. ............ 327/175 |
| 6,967,514 | B2 | * | 11/2005 | Kizer et al. ......... 327/175 |
| 7,005,904 | B2 | * | 2/2006  | Minzoni ........... 327/175 |

* cited by examiner

*Primary Examiner*—Cassandra Cox
(74) *Attorney, Agent, or Firm*—Garlick Harrison & Markison; Timothy W. Markison; Kevin L. Smith

(57) ABSTRACT

A method and apparatus for generating a fifty percent duty cycle clock from a reference clock. The method and apparatus includes an edge generator, a controllable delay module, a duty cycle control loop module and a reset circuit. The edge generator is coupled to generate a clean edge of the reference clock. The controllable delay module is coupled to produce a delayed edge from the clean edge based on a duty cycle control signal. The duty cycle control loop module is coupled to generate the duty cycle control signal based on the delayed edge and the reference clock signals. The reset circuit is coupled to reset the edge generator to produce a second edge. The second edge is delayed by the controllable delay module to produce a second delayed edge such that the delayed edge and the second delayed edge constitute one period of the fifty percent duty cycle clock.

27 Claims, 7 Drawing Sheets local oscillator module 74 local oscillator module 74

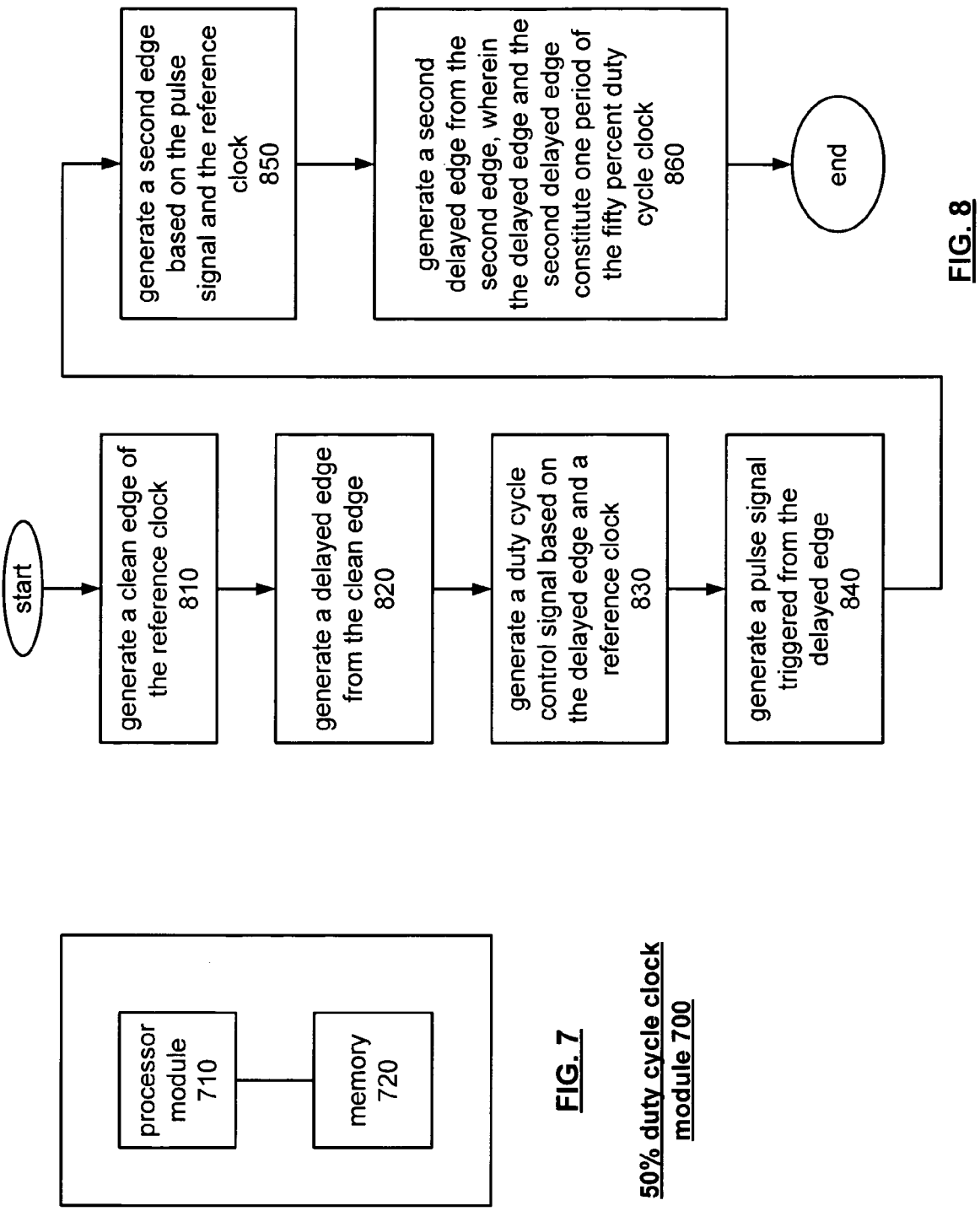

CLOCK GENERATOR HAVING A 50% DUTY-CYCLE

This patent application is claiming priority under 35 USC § 120 as a continuing patent application of patent application entitled 50% DUTY-CYCLE CLOCK GENERATOR, having a filing date of Apr. 25, 2002, and a Ser. No. of 10/132,856, now issued as U.S. Pat. No. 6,990,143.

TECHNICAL FIELD OF THE INVENTION

This invention relates generally to communication systems and more particularly to an oscillator module that provides an output signal having a fifty percent (50%) duty cycle for use in such communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof. Each standard typically dictates the type of communication, type of encoding, type of modulation, channel access protocols, data rates, et cetera, to be performed by the wireless communication devices.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication session between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. The filtering stage filters the baseband signal or the IF signal to attenuate unwanted out of band signals to produce a filtered signal. The data recovery stage recovers raw data from the filtered signal in accordance with the particular wireless communication standard.

To ensure that data is properly transmitted and recaptured by wireless communication devices, the standard to which the wireless communication devices are compliant prescribes one or more data rates. Traditionally, the processing performed by a wireless communication device was done on a "one processing step per one clock interval" basis. As the need for greater speed of performance increased, many wireless communication devices employed parallel processing using co-processors and some further employed double edge processing.

As is known, double edge processing allows a processing device to perform one processing step on the rising edge of the clock and another processing step on the falling edge of the clock. To ensure that each processing step, i.e., the one on the rising edge and the one on the falling edge, have an equal amount of time to be completed, the processing device should be clocked by a 50% duty cycle clock. As is also known, if an imbalanced duty cycle clock is used (e.g., 60%/40% duty cycle clock), the processing of both steps must be completed during the shorter of the two portions of the clock (e.g., the 40% portion).

Because of the need for an accurate 50% duty cycle clock to improve performance of processing devices, including processing devices within wireless communication devices, many implementations of 50% duty cycle clocks have been developed. For example, a phase locked loop (PLL) may be used to produce a clock that is twice the desired clocking rate to produce the desired 50% duty cycle clock. However, PLLs are relatively complex circuits and, when implemented on an integrated circuit (IC), consume a relatively large portion of the IC real estate, which adds to the cost and power consumption of the IC.

Other 50% duty cycle clock implementations include some form of post processing or feedback processing to better control the duty cycle of reference clock. While such post processing and feedback processing provide a 50% duty cycle clock, they are relatively complex circuits and, when implemented on an integrated circuit (IC), consume a relatively large portion of the IC real estate, which adds to the cost and power consumption of the IC.

Therefore, a need exists for a 50% duty cycle clock that is readily suitable for implementation on an integrated circuit due to its minimal power consumption and economy of design.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

FIG. 7 illustrates a schematic block diagram of another embodiment of a fifty percent duty cycle clock module in accordance with the present invention; and FIG. 8 illustrates a flow chart of a method of generating a fifty percent duty cycle clock from a reference clock in accordance with the present invention.

DETAILED DESCRIPTION OF A PREFERRED EMBODIMENT

Figure 1:
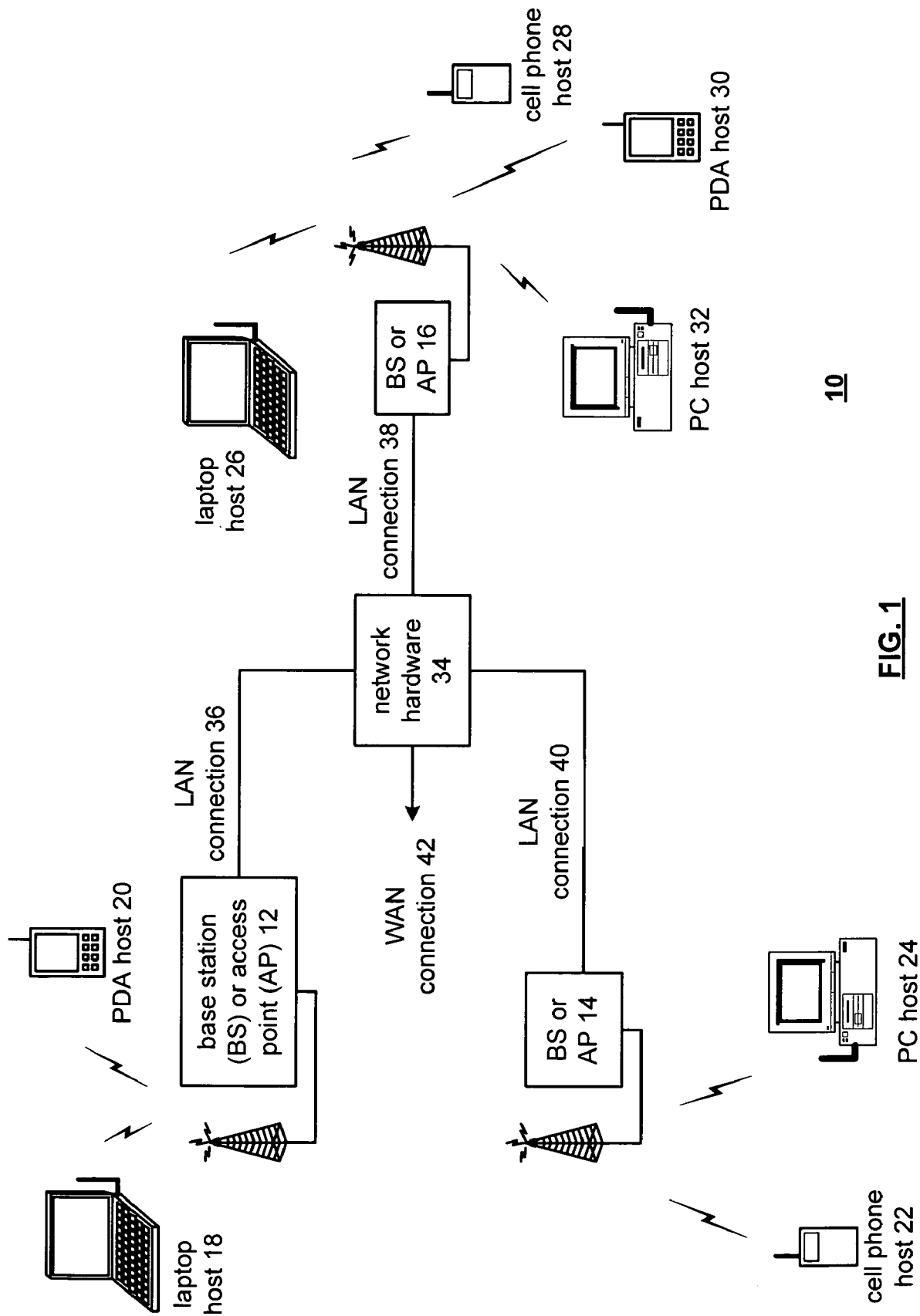
FIG. 1 illustrates a schematic block diagram of a communication system that includes wireless communication devices having radio frequency integrated circuits in accordance with the present invention.

FIG. 1 illustrates a schematic block diagram of a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12, 14, and 16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
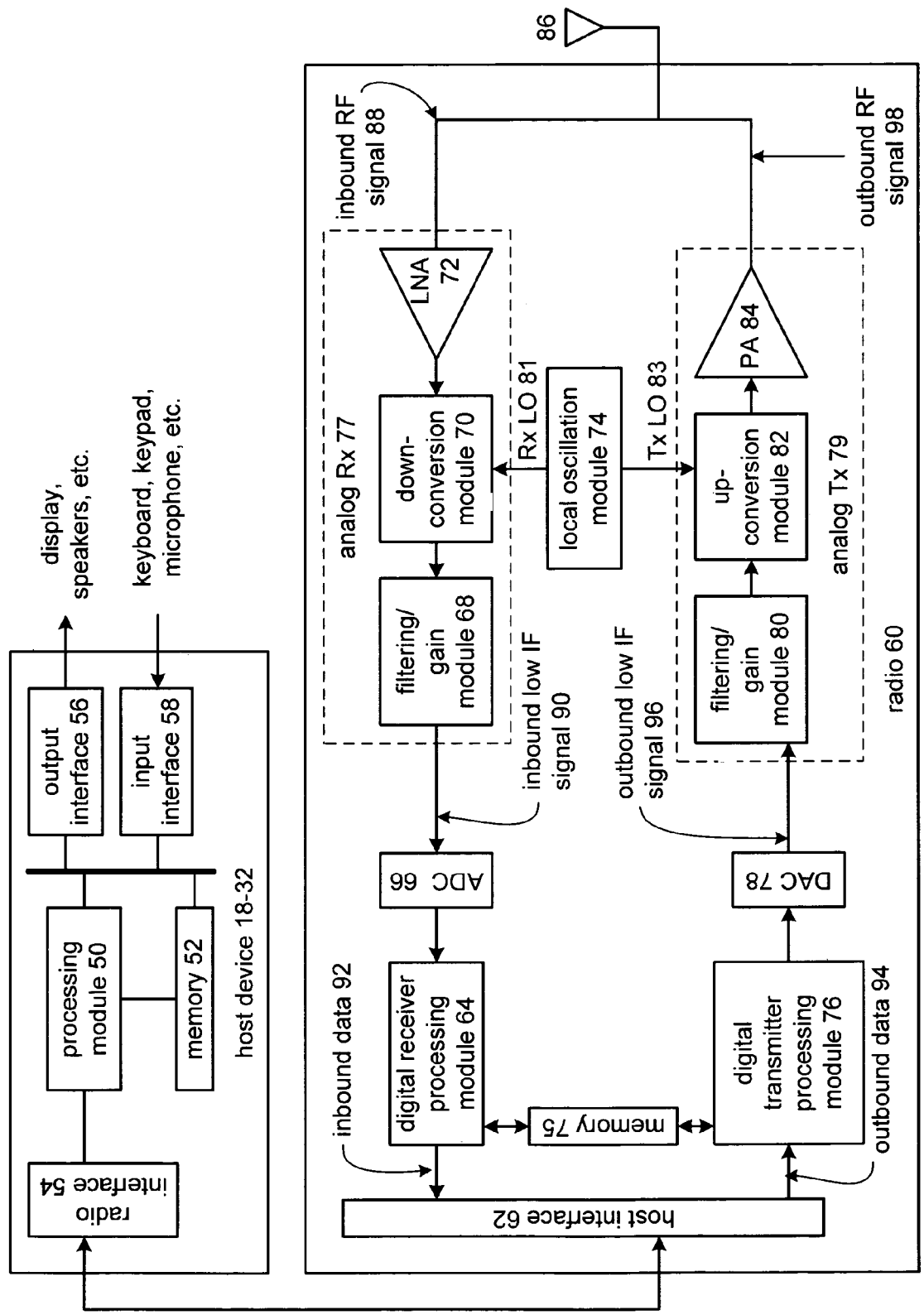
FIG. 2 illustrates a schematic block diagram of a host device and corresponding radio in accordance with the present invention.

FIG. 2 illustrates a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received inbound data may be displayed and/or rendered audible. The radio interface 54 also provides outbound data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, analog-to-digital converter 66, filtering/gain module 68, down conversion module 70, low noise amplifier 72, local oscillation module 74, memory 75, digital transmitter processing module 76, digital-to-analog converter 78, filtering/gain module 80, up-conversion module 82, power amplifier 84, and an antenna 86. The antenna 86 may be a single antenna that is shared by the transmit and receive paths or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions of one or more of a plurality of wireless transceiver standards, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion.

The digital receiver 64, and the transmitter processing modules 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64, and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72, which amplifies the signal 88 to produce an amplified inbound RF signal. The low noise amplifier 72 provide the amplified inbound RF signal to the down conversion module 70, which directly converts the amplified inbound RF signal into an inbound low IF signal based on a receiver local oscillation 81 provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

Figure 3:
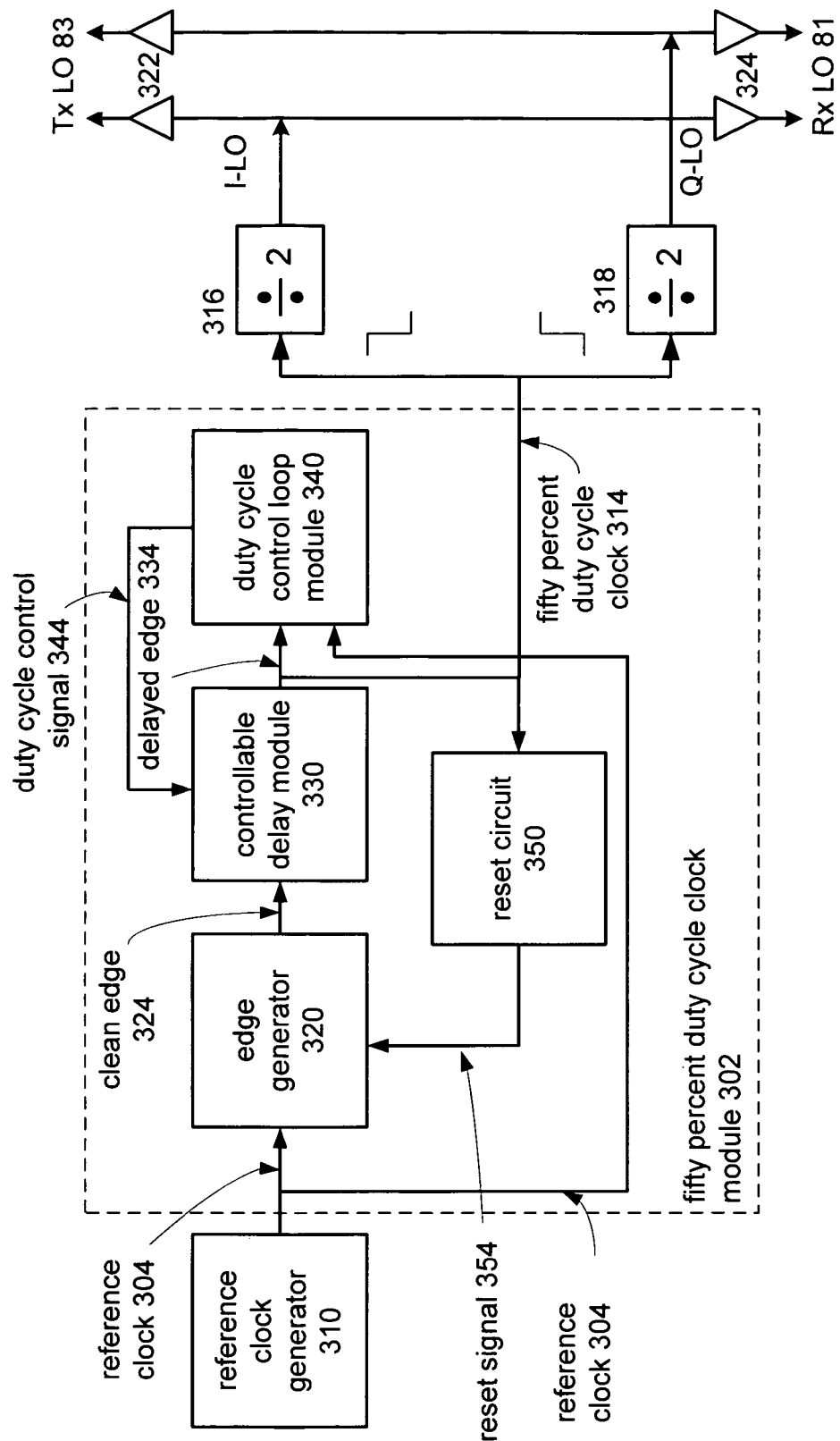
FIG. 3 illustrates a schematic block diagram of a local oscillation module in accordance with the present invention.

FIG. 3 illustrates a schematic block diagram of the local oscillation module 74. The local oscillation module 74 includes reference clock generator 310, a fifty percent duty cycle clock module 302, divide by two modules 316 and 318, and a plurality of buffers 322 and 324. The fifty percent duty cycle clock module 302 includes an edge generator 320, controllable delay module 330, duty cycle control loop module 340, and reset circuit 350.

Figure 4:
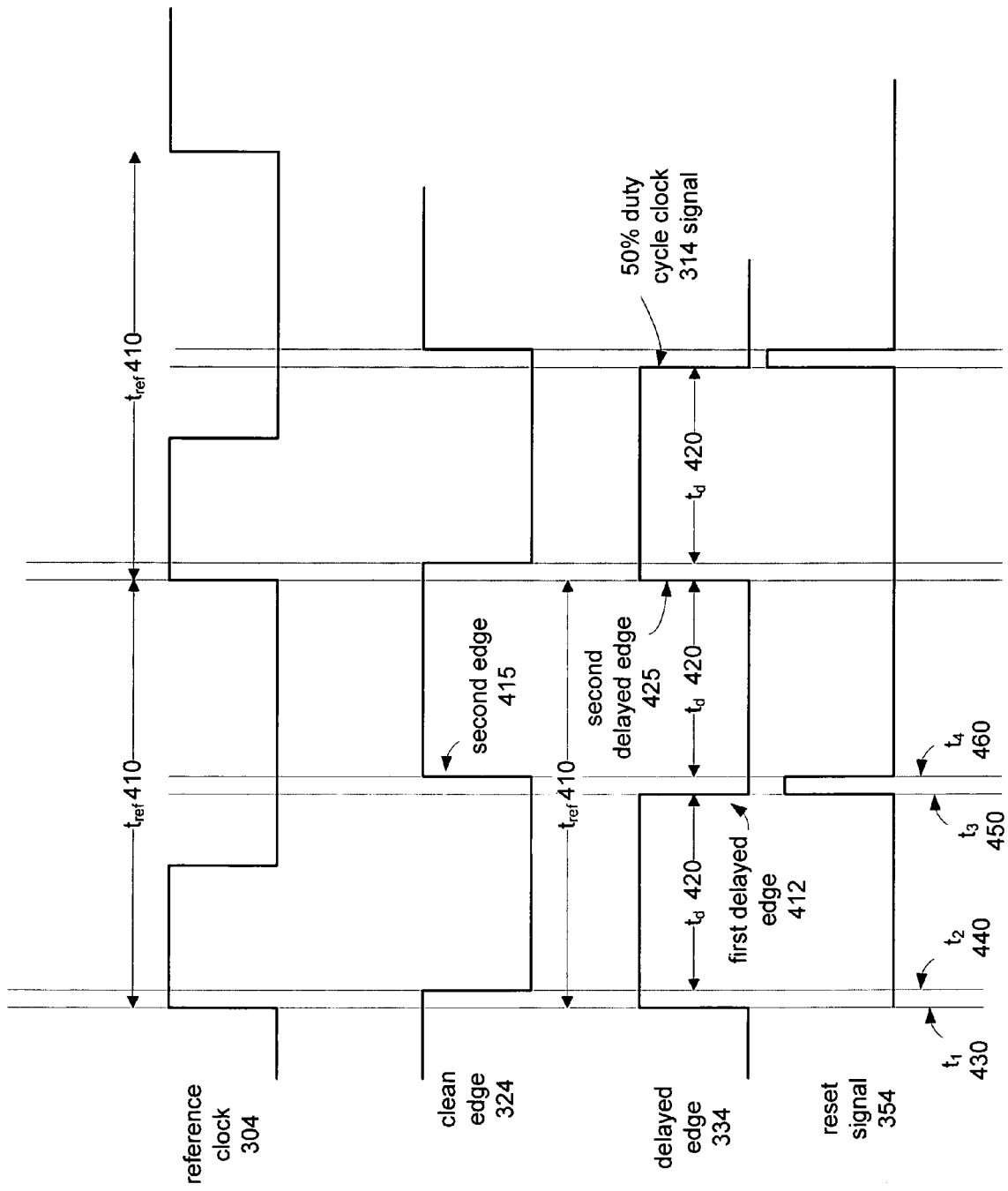
FIG. 4 illustrates a steady state timing diagram for a local oscillation module in accordance with the present invention.

In operation, the reference clock generator 310, which may be a crystal oscillator or other clocking circuit, produces a reference clock 304 and provides it to the fifty percent duty cycle clock module 302. The edge generator 320 receives the reference clock 304 and generates a clean negative edge transition from a positive edge transition of the reference clock 304. Referring to FIG. 4, the reference clock 304 has a time period $t_{ref}$ 410, but does not have a fifty percent duty cycle. As is further shown in FIG. 4, for each rising edge of the reference clock 304, the edge generator 320 generates a clean falling edge 324. As one of average skill in the art will appreciate, the rising and falling edges of the reference clock 304 and the corresponding clean edges 324 may be opposite from the ones illustrated in FIG. 4 or may be aligned (i.e., the clean edge 324 has a rising edge based on a rising edge of the reference clock 304).

Referring back to FIG. 3, the controllable delay module 330, which may be a controllable delay line, delays the clean edge 324 based on a duty cycle control signal 344 to produce a delayed edge 334. In essence, the duty cycle control signal 344 directs how long the controllable delay module 330 will delay the clean edge 324. The duty cycle control loop module 340 generates the duty cycle control signal 344 by comparing phase and/or frequency alignment of delayed edge signal 334 and the reference clock 304 signal. For example, when the rising edge of the delayed edge signal 334, which is the 50% duty cycle clock, leads the rising edge of the reference clock 304, the delay of the controllable delay module 330 is too short. Accordingly, the duty cycle control loop module 340 adjusts the duty cycle control signal 344 such that the controllable delay module 330 delays the clean edge 324 a little longer. Conversely, when the rising edge of the reference clock leads the rising of the 50% duty cycle clock, the delay of the controllable delay module 330 is too long. As such, the duty cycle control loop module 340 produces the duty cycle control signal 344 such that the controllable delay module 330 shortens the delaying of the clean edge. Again referring to FIG. 4, the delayed edge 334 mimics the clean edge signal 324 but delayed in time by $t_d$ 420, which corresponds to the duty cycle control signal 344, to produce a first delayed edge 412 of one period of a fifty percent duty cycle clock 314.

Referring back to FIG. 3, the reset circuit 350 generates a reset signal 354 at the trailing edge of the delayed edge signal 334. The reset circuit 350 provides the reset signal 354 to the edge generator 320, which resets the edge generator 320 and produces a second edge 415 of the clean edge signal 324. The controllable delay 330 module delays the second edge 415 in accordance with the duty cycle control signal 344 to produce a second delayed edge 425 of the 50% duty cycle clock, i.e., the delayed edge signal 334. Again referring to FIG. 4, the second delayed edge 425 constitutes the rising edge of the next period of the 50% duty cycle clock and is delayed by the same amount of time $t_d$ 420 from the second edge 415 of the clean edge signal 324 as the first delayed edge 412 is delayed from the first edge of the clean edge signal 324. As is further illustrated in FIG. 4, the transition of the clean edge signal 324 with respect to a rising edge of the reference clock 304 is delayed by the propagation delay of the edge generator 320, which is the difference in time between time $t_1$ 430 and time $t_2$ 440. As is also illustrated in FIG. 4, the second edge 415 of the clean edge signal 324 is delayed from the rising edge of the reset signal 354 by the propagation delay of the edge generator 320. As such, two propagation delays of the edge generator and two time delays 420 equal the period 410 of the reference clock 304. Since one propagation delay of the edge generator corresponds to one time delay, the resulting clock is a fifty percent duty cycle clock 314.

Divide by two module 316 divides the fifty percent duty cycle clock 314 by two on the rising edge of the clock 314 to produce an in-phase component for the transmit and receive local oscillations 81 and 83. Divide by two module 318 divides the fifty percent duty cycle clock by two on the falling edge of the clock 314 to produce a quadrature component of the receive and transmit local oscillations 81 and 83.

Figure 5:
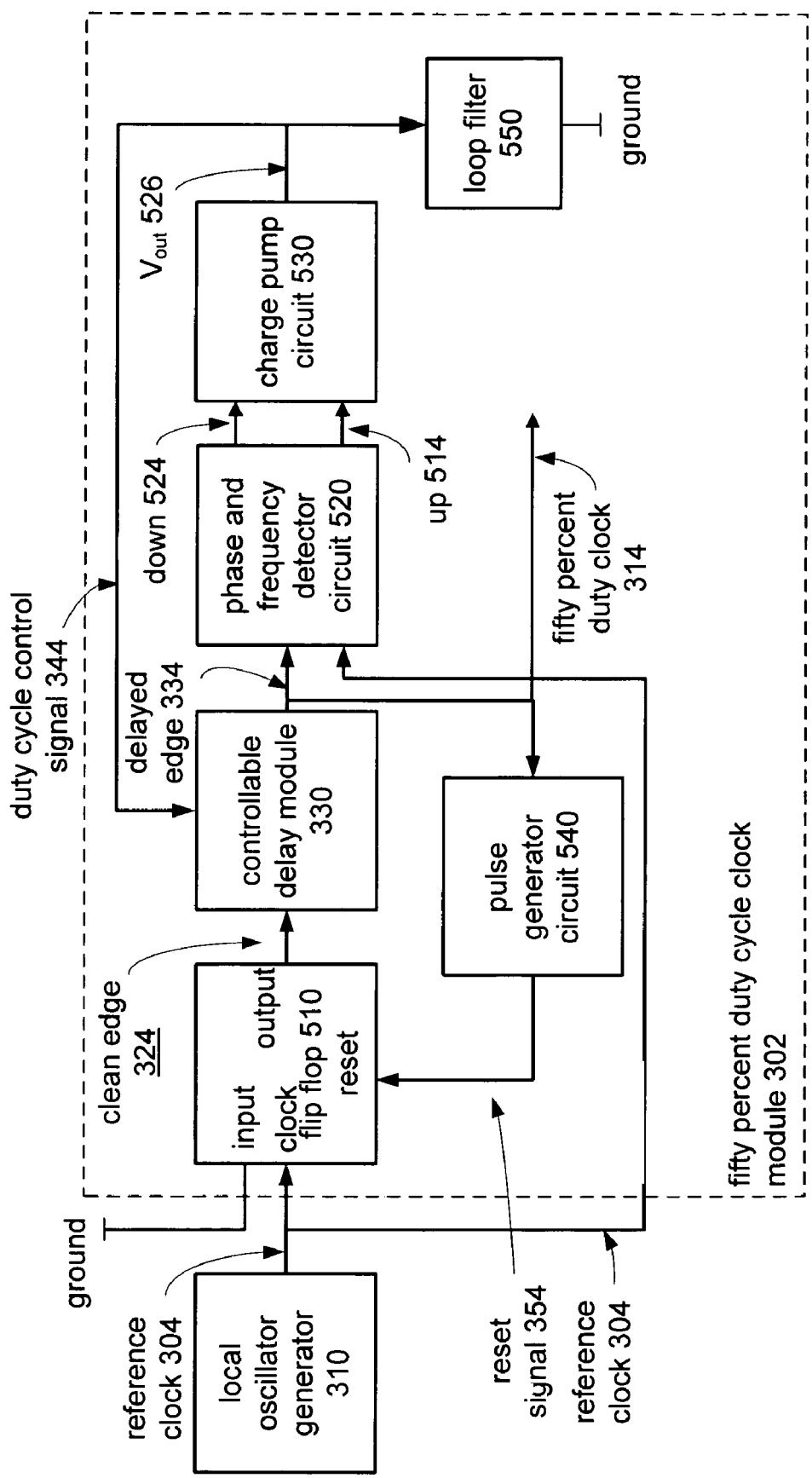
FIG. 5 illustrates a schematic block diagram of an embodiment of a fifty percent duty cycle clock module in accordance with the present invention.

FIG. 5 illustrates a schematic block diagram of the fifty percent duty cycle clock module 302 in greater detail. The fifty percent duty cycle clock module 302 includes a flip flop 510 representing the edge generator 320, the controllable delay module 330, a phase and frequency detector circuit 520, a charge pump circuit 530 and a loop filter 550 representing the duty cycle control loop module 340, and a pulse generator circuit 540 representing the reset circuit 350.

In this embodiment, the edge generator 320 is a flip flop 510 that has an input set to ground, a clock input coupled to the reference clock 304 signal, and a reset input coupled to the reset signal 354. As illustrated in FIG. 4 steady state timing diagram, when the reference clock 304 signal changes from a low state to a high state, the clean edge 324 signal output of the flip flop 510 changes from a high state to a low state, based on the leading edge of the reference clock 304. When the reset signal 354 is asserted, the clean edge 324 output goes to a high state, after propagation delay of the edge generator 320.

The phase and frequency detector circuit 520 compares the delayed edge 334 signal and the reference clock 304 signal for phase and/or frequency alignment. In response to the deviation between the two signals, the phase and frequency detector circuit 520 generates an up 514 signal and/or a down 524 signal to reduce the deviation. If no deviation is present, the phase and frequency detector circuit 520 generates a no-change signal.

A charge-up state is achieved by asserting the up 514 signal of the tri-state phase detector 520 and deasserting the down 524 signal. A charge-down state is achieved by asserting the down 524 signal and deasserting the up 514 signal. An off state is achieved by concurrently asserting the up 514 signal and the down 524 signal. The off state may also be achieved by concurrently deasserting the up 514 signal and the down 524 signal.

The charge pump circuit 530 receives the up 514 signal and the down 524 signal and generates therefrom a voltage output signal 526. The voltage output signal 526 is a corrective feedback signal, e.g., the duty cycle control signal 104, to align the rising edges of the delayed edge 334 and the reference clock 304 signals. When alignment occurs, $t_{ref}$ 410=2*$t_d$ 420+propagation delays and the delayed edge 334 signal corresponds to the fifty percent duty cycle clock 314 signal. A loop filter 550, which typically includes a capacitor, filters out low frequency components of the duty cycle control signal 104.

The controllable delay module 330 may be implemented by using a voltage controlled delay line circuit using starvation transistors (not shown). The duty cycle control signal 344 is used to control the time delay $t_d$ 420.

The reset circuit 350 includes a pulse generator circuit 540. The pulse generator circuit 540 produces a pulse output triggered by the trailing edge of the delayed edge 334 signal, e.g., first delayed edge 412. The rising edge of the pulse output, e.g., the reset signal 354, sets the flip flop 510 to a high state.

Figure 6:
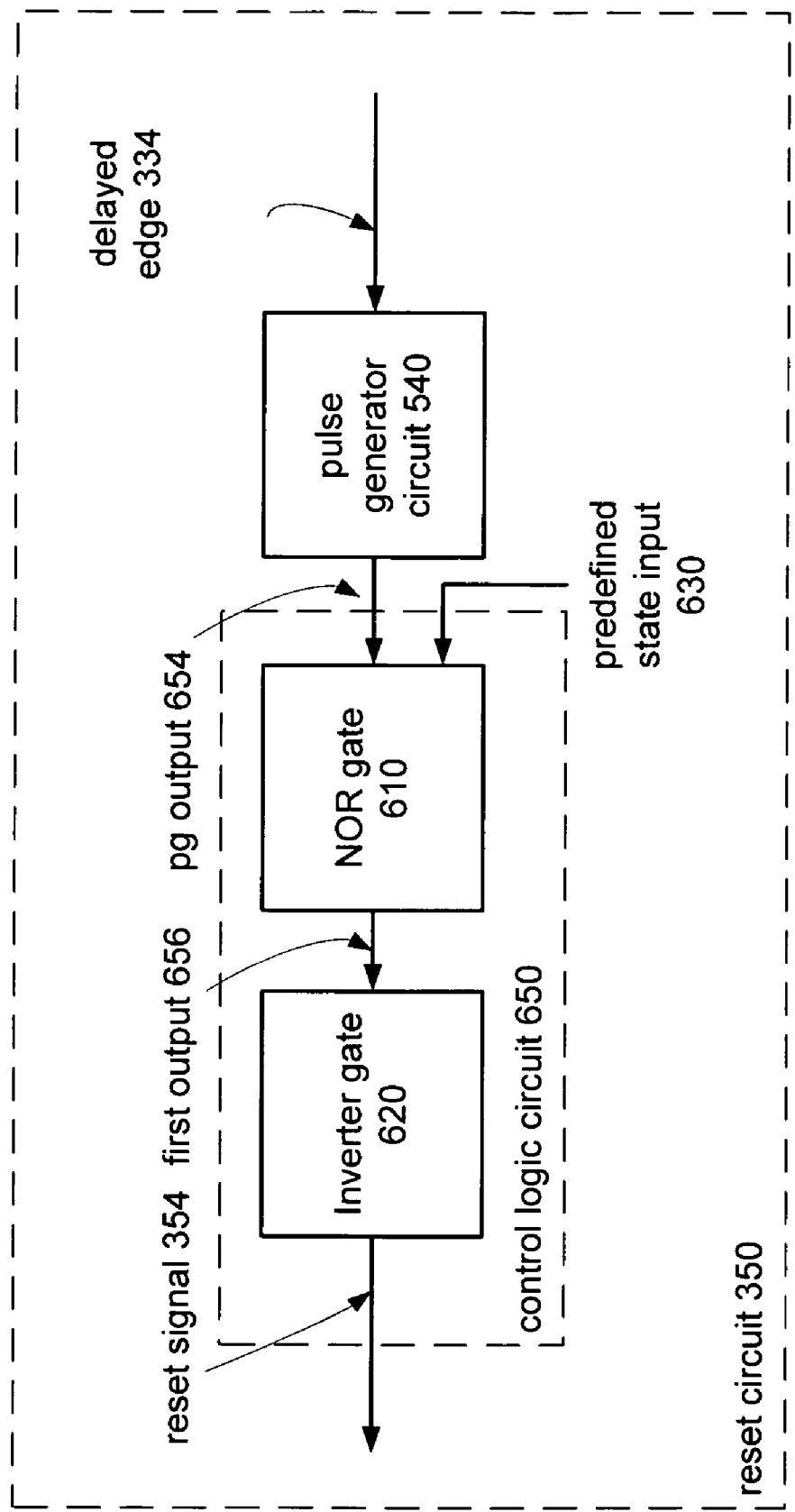
FIG. 6 illustrates a schematic block diagram of a reset circuit in accordance with another embodiment of the present invention.

FIG. 6 illustrates a schematic block diagram of the reset circuit 350 that includes the pulse generator circuit 540 and a control logic circuit 650. The control logic circuit 650 includes a NOR gate 610 and an inverter gate 620. On initial power-on conditions, the radio 60 typically goes through a startup phase. The initial states of various devices such as flip flop 510 may be undefined at start. The control logic circuit 650 provides a predefined state for the flip flop 510 on initial power-on conditions.

The NOR gate 610 includes two inputs and provides a first output 656. The two NOR gate inputs include a predefined state input 630 and another input which is pg output 654 of the pulse generator circuit 540. The first output 656 of the NOR gate 610 is inverted and applied to the reset input of the flip flop 510. The predefined state input 630 establishes that, independent of the pg output 654, the flip flop 510 has a predefined initial state. For example, if the predefined initial state input 630 is set to a high state for a brief period of time, the output of the inverter 620, e.g., reset signal 354, is also a high state. Referring to FIG. 4, when reset signal 354 is asserted the clean edge 324 output of the flip flop 510 is also set to a high state.

As one of average skill in the art will appreciate, the local oscillation module 74 described herein above may be implemented in various forms. For example, the local oscillation module 74 may be implemented as an integrated circuit (IC) to lower cost, space and heat dissipation. In applications that may have development time constraints, the local oscillation module 74 may be implemented as an electronic circuit that includes readily available individual components. Applications that may have flexible or changing requirements the local oscillation module 74 may be implemented as a processor.

FIG. 7 illustrates a schematic block diagram of the fifty percent duty cycle clock module 302 that includes a processor module 710 and memory 720. The processor module 710 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 720 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 32 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 720 stores, and the processor module 710 executes, operational instructions corresponding to at least some of the steps and/or functions illustrated in FIG. 8.

FIG. 8 illustrates a schematic flow chart of a method of generating the fifty percent duty cycle clock 314 from the reference clock 304, in accordance with the present invention. In step 810, the clean edge 324 signal is generated from the reference clock 304. In step 820, the delayed edge 334 is generated from the clean edge 324, the delayed edge being controlled by the duty cycle control signal 344. In step 830, the duty cycle control signal 344 is generated based on the delayed edge 334 and the reference clock 304. In step 840, a pulse signal, e.g., the reset signal 354 is generated, the pulse signal being triggered from the delayed edge 334 signal. In step 850, the second edge 415 signal is generated based on the reset signal 354. In step 860, the second delayed edge 425 signal is generated from the second edge 415, wherein the delayed edge 334 and the second delayed edge 425 constitute one period $t_{ref}$ 410 of the fifty percent duty cycle clock 314.

The preceding discussion has presented a radio frequency circuit that produces a fifty percent duty cycle clock from a reference clock. Accordingly, radio transceivers utilizing the teachings of the present invention are more reliable in wireless communication devices, consume less power, produce less errors, and are more cost effective than previous radio frequency circuits. As one of average skill in the art will appreciate, other embodiments may be derived from the teaching of the present invention, without deviating from the scope of the claims.

What is claimed is:

1. A fifty percent duty cycle clock generator comprises:
    edge generator operably coupled to generate a clean edge of a reference clock;
    controllable delay module operably coupled to produce a delayed edge from the clean edge based on a duty cycle control signal;
    duty cycle control loop module operably coupled to generate the duty cycle control signal based on the delayed edge and the reference clock; and
    reset circuit operably coupled to reset the edge generator to produce a second edge, wherein the second edge is delayed by the controllable delay module to produce a second delayed edge such that the delayed edge and the second delayed edge constitute one period of the fifty percent duty cycle clock.

2. The fifty percent duty cycle clock generator of claim 1, wherein the edge generator further comprises a flip flop with input coupled to ground, a clock input coupled to the reference clock, and a reset input coupled to the reset circuit.

3. The fifty percent duty cycle clock generator of claim 1, wherein the duty cycle control loop module comprises a phase detector and a charge pump to produce the duty cycle control signal, wherein the phase detector receives the delayed edge and the reference clock as inputs and produces a charge-up signal and a charge-down signal as outputs, wherein the charge pump receives the charge-up signal and the charge-down signal as inputs and produces the duty cycle control signal as output.

4. The fifty percent duty cycle clock generator of claim 3, wherein the phase detector compares phase and frequency of the delayed edge and the reference clock to produce the charge-up signal and the charge-down signal, the charge-up signal and the charge-down signal resulting in placing the phase detector in a charge-up state, a charge-down state or an off state.

5. The fifty percent duty cycle clock generator of claim 3, wherein the duty cycle control loop module further comprises:
    a low pass filter operably coupled to receive the duty cycle control signal from the charge pump, wherein the low pass filter filters out low frequency components of the duty cycle control signal.

6. The fifty percent duty cycle clock generator of claim 1, wherein the reset circuit comprises a narrow pulse generator triggered from the delayed edge to produce a reset signal output, wherein the reset signal output resets the edge generator.

7. The fifty percent duty cycle clock generator of claim 1, wherein the reset circuit further comprises:
    a narrow pulse generator operably coupled to trigger from the delayed edge and generate a pulse output; and
    a control logic circuit operably coupled to receive the pulse output and provide a reset signal output to reset the edge generator.

8. The fifty percent duty cycle clock generator of claim 7, wherein the control logic circuit receives an input signal having an initial predefined state, the initial predefined state establishing a known initial state of the edge generator.

9. The fifty percent duty cycle clock generator of claim 7, wherein the control logic further comprises:
    a NOR gate operably coupled to receive a first input signal having a predefined state at start, the pulse output as a second input, and generate a first output; and
    an Inverter operably coupled to receive the first output as an input and provide the reset signal to reset the edge generator.

10. A method of generating a fifty percent duty cycle clock from a reference clock, the method comprising:
    generating a clean edge of the reference clock;
    generating a delayed edge from the clean edge, the delayed edge being controlled by a duty cycle control signal;
    generating the duty cycle control signal based on the delayed edge and the reference clock;
    generating a pulse signal triggered from the delayed edge;
    generating a second edge based on the pulse signal and the reference clock; and
    generating a second delayed edge from the second edge, wherein the delayed edge and the second delayed edge constitute one period of the fifty percent duty cycle clock.

11. The method of claim 10, wherein the clean edge is generated by an edge generator, wherein the edge generator comprises a flip flop with input coupled to ground, a clock input coupled to the reference clock, and a reset input coupled to a reset circuit.

12. The method of claim 11, wherein the pulse signal is generated by the reset circuit, wherein the reset circuit comprises a narrow pulse generator triggered from the delayed edge, wherein the pulse signal resets the edge generator.

13. The method of claim 11, wherein the reset circuit further comprises:
    a narrow pulse generator operably coupled to trigger from the delayed edge and generate a pulse generator output signal; and
    a control logic circuit operably coupled to receive the pulse generator output signal and provide the pulse signal to reset the edge generator.

14. The method of claim 13, wherein the control logic circuit receives an input signal having an initial predefined state, the initial predefined state establishing a known initial state of the edge generator.

15. The method of claim 13, wherein the control logic further comprises:
    a NOR gate operably coupled to receive a first input signal having a predefined state at start, the pulse generator output as a second input, and generate a first output; and an Inverter operably coupled to receive the first output as an input and provide the pulse signal as an output to reset the edge generator.

16. The method of claim 10, wherein the duty cycle control signal is generated by a duty cycle control loop module comprising a phase detector and a charge pump, wherein the phase detector receives the delayed edge and the reference clock as inputs and produces a charge-up signal and a charge-down signal as outputs, wherein the charge pump receives the charge-up signal and the charge-down signal as inputs and produces the duty cycle control signal as output.

17. The method of claim 16, wherein the phase detector compares phase and frequency of the delayed edge and the reference clock to produce the charge-up signal and the charge-down signal, the charge-up signal and the charge-down signal resulting in placing the phase detector in a charge-up state, a charge-down state or an off state.

18. The method of claim 16, wherein the duty cycle control loop module further comprises:
a low pass filter operably coupled to receive the duty cycle control signal from the charge pump, wherein the low pass filter filters out low frequency components of the duty cycle control signal.

19. An apparatus for generating a fifty percent duty cycle clock, the apparatus comprising:
a processing module; and
a memory operably coupled to the processing module, wherein the memory includes operational instructions that cause the processing module to:
generate a clean edge of a reference clock;
generate a delayed edge from the clean edge, the delayed edge being controlled by a duty cycle control signal;
generate the duty cycle control signal based on the delayed edge and the reference clock;
generate a pulse signal triggered from the delayed edge;
generate a second edge based on the pulse signal and the reference clock; and
generate a second delayed edge from the second edge, wherein the delayed edge and the second delayed edge constitute one period of the fifty percent duty cycle clock.

20. The apparatus of claim 19, wherein the clean edge is generated by an edge generator, wherein the edge generator comprises a flip flop with input coupled to ground, a clock input coupled to the reference clock, and a reset input coupled to a reset circuit.

21. The apparatus of claim 20, wherein the pulse signal is generated by the reset circuit, wherein the reset circuit comprises a narrow pulse generator triggered from the delayed edge, wherein the pulse signal resets the edge generator.

22. The apparatus of claim 20, wherein the reset circuit further comprises:
a narrow pulse generator operably coupled to trigger from the delayed edge and generate a pulse generator output signal; and
a control logic circuit operably coupled to receive the pulse generator output signal and provide the pulse signal as an output to reset the edge generator.

23. The apparatus of claim 22, wherein the control logic circuit receives an input signal having an initial predefined state, the initial predefined state establishing a known initial state of the edge generator.

24. The apparatus of claim 22, wherein the control logic further comprises:
a NOR gate operably coupled to receive a first input signal having a predefined state at start, the pulse generator output as a second input, and generate a first output; and
an Inverter operably coupled to receive the first output as an input and provide the pulse signal as an output to reset the edge generator.

25. The apparatus of claim 19, wherein the duty cycle control signal is generated by a duty cycle control loop module comprising a phase detector and a charge pump, wherein the phase detector receives the delayed edge and the reference clock as inputs and produces a charge-up signal and a charge-down signal as outputs, wherein the charge pump receives the charge-up signal and the charge-down signal as inputs and produces the duty cycle control signal as output.

26. The apparatus of claim 25, wherein the phase detector compares phase and frequency of the delayed edge and the reference clock to produce the charge-up signal and the charge-down signal, the charge-up signal and the charge-down signal resulting in placing the phase detector in a charge-up state, a charge-down state or an off state.

27. The apparatus of claim 25, wherein the duty cycle control loop module further comprises:
a low pass filter operably coupled to receive the duty cycle control signal from the charge pump, wherein the low pass filter filters out low frequency components of the duty cycle control signal.

* * * * *